United States Patent [19]

Lemmer

[11] 4,314,402
[45] Feb. 9, 1982

[54] DEVICE FOR ASSEMBLING PRINTED CIRCUIT BOARDS

[76] Inventor: Alfred Lemmer, Munich, Fed. Rep. of Germany

[21] Appl. No.: 65,148

[22] Filed: Aug. 9, 1979

[30] Foreign Application Priority Data

Aug. 11, 1978 [DE] Fed. Rep. of Germany ....... 2835341

[51] Int. Cl.³ .............................................. H05K 3/30
[52] U.S. Cl. ....................................... 29/721; 29/741; 29/833; 353/28
[58] Field of Search ................ 29/741, 720, 721, 833; 353/28, 62, 122; 364/489, 491

[56] References Cited

U.S. PATENT DOCUMENTS

| | | | |
|---|---|---|---|
| 1,127,725 | 2/1915 | Brink | 353/42 |
| 2,957,389 | 10/1960 | Moore | 353/42 |
| 3,609,846 | 10/1971 | Freeman | 29/721 |

Primary Examiner—Carl E. Hall
Attorney, Agent, or Firm—Fitzpatrick, Cella, Harper & Scinto

[57] ABSTRACT

A device for assembling printed circuit boards with an optical illuminating system for illumination of the holes in the printed circuit board into which components are to be installed. The optical system, or a mirror forming a portion thereof, is arranged, on a pantograph linkage for example, so as to be maneuverable above and parallel to the circuit board. The optical system is provided with specially mounted shutters which can be moved specified amounts to direct the light to precise selected locations on the circuit board.

29 Claims, 17 Drawing Figures

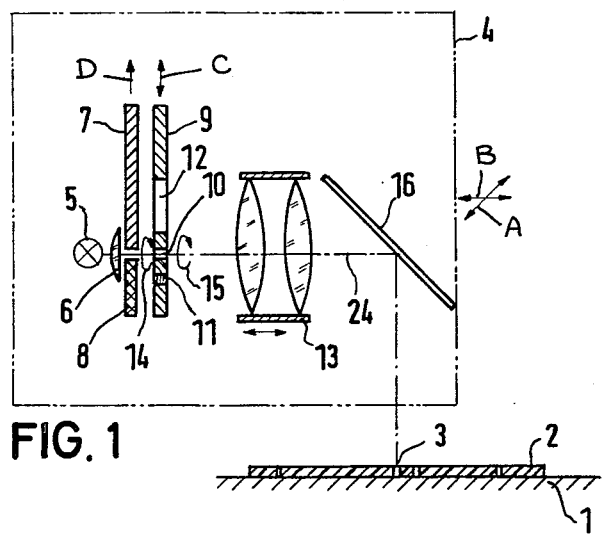

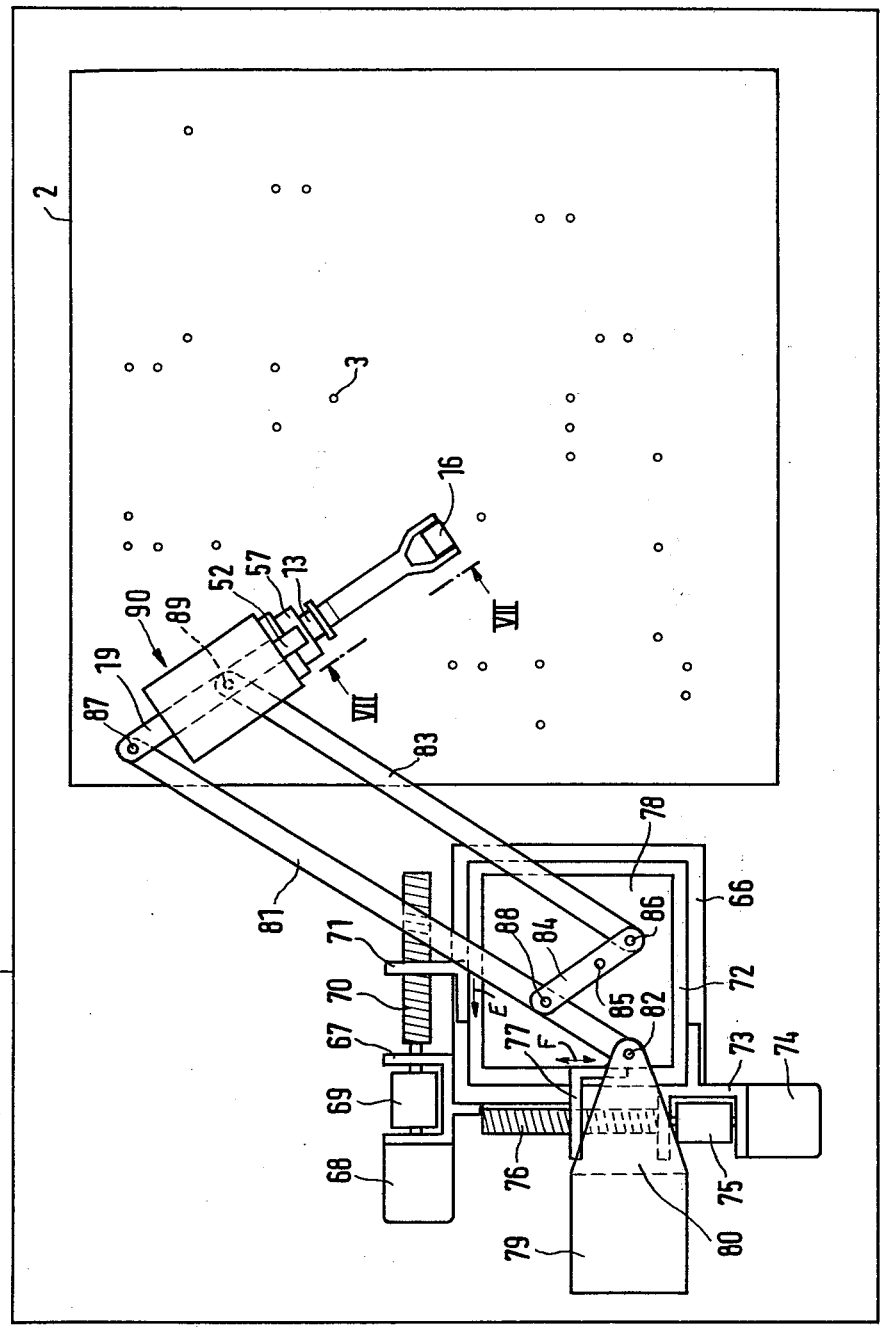

DEVICE FOR ASSEMBLING PRINTED CIRCUIT BOARDS

BACKGROUND OF THE INVENTION

1. Field of the Invention

This invention concerns a device for assembling printed circuit boards with an optical illuminating system for illumination of the holes in the printed circuit board into which components are to be installed.

2. Description of the Prior Art

Devices are known in which a projector is arranged at a distance above a printed circuit board to be assembled so as to be viewed by a person performing assembly operations from behind the board. Templates provided with holes are inserted into the projector. The template holes form an assembly pattern of reduced size. Rays of light penetrating through the holes are deflected downwardly by a mirror arranged directly above the printed circuit board to be assembled, so that they fall on the board. A plurality of holes may be illuminated simultaneously with such templates.

In another known device an optical system is arranged directly above the printed circuit board, but at a considerably greater distance than the mirror in the aforementioned device. This optical system is electronically controlled such that a single point of light in each instance travels to and fro between two holes to be fitted with a component.

In both systems described above the beam of light falls into the outer region of the printed circuit board, whereby larger components already mounted on the board may cut off nearby holes.

It is an object of this invention, therefore, to provide a device by which it is possible to cause beams of light serving for illumination of the holes to fall on the printed circuit board vertically or almost vertically.

SUMMARY OF THE INVENTION

According to the present invention there is provided a device for assembling printed circuit boards using an optical illumination system in which the illumination system, or a mirror forming a portion thereof, is arranged so as to be maneuverable above and parallel to the printed circuit board. In the preferred embodiment wherein the optical system is arranged on the lever of a pantograph and the beams of light emitted by the optical system are deflected by way of a small mirror onto the printed circuit board, the mirror may be arranged at a relatively low height above the board, since it scarcely obstructs ones view. This has the advantage that the intensity of light of the optical system may be relatively low.

A further advantage of the arrangement described above is that the position of the mirror above the printed circuit board initially gives the assembler a rough indication of the points on the board at which the illuminated holes are to be found.

In its more specific aspects, the present invention incorporates a slide plate with holes and a slot, as well as a movable shutter arranged in the region of the slot to provide additional important advantages over prior systems. This last mentioned arrangement makes it possible for the entire region between two holes into which a component is to be installed to be spanned constantly (i.e. non-oscillatingly) by a single beam of light. This considerably facilitates the insertion of components and reduces the photoelectric fatigue of the operator hitherto produced in the prior oscillating systems.

It has also been found that by use of a second hole in the slide plate, which is filled or covered with a transparent colored material, the polarity may be shown for the components which are to be inserted into the corresponding holes between which the beam of light extends. The shape of the two holes in the slide plate may be selected as desired. Particular geometric shapes, representing assembly symbols, may be selected for this.

Control of the device pursuant to the invention is effected by an electronic control system which may be programmed.

BRIEF DESCRIPTION OF THE DRAWINGS

An example of the invention is described below by means of the drawings, in which:

FIG. 1 is a diagramatic representation of a device for assembling printed circuit boards pursuant to the invention;

FIGS. 2a-e illustrate a variety of light symbols which may be projected onto a printed circuit board to be assembled with the device of FIG. 1;

FIGS. 3a-f illustrate various stages in programming and assembly using the device of FIG. 1;

FIG. 6 is an overall plan view of the device of FIG. 1;

DETAILED DESCRIPTION OF THE PREFERRED EMBODIMENT

Figure 4:
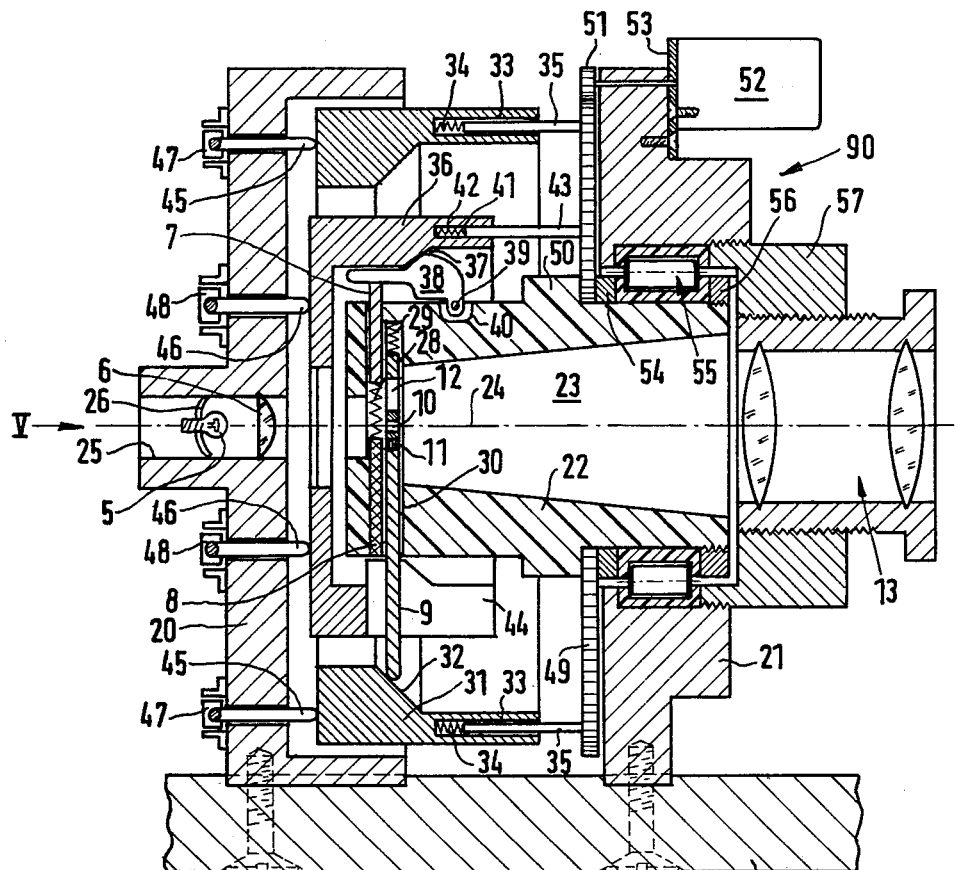
FIG. 4 is an enlarged section view showing the construction of the optical illuminating system used in the device of FIG. 1.

FIG. 1 shows a support 1, for example an assembly table, on which rests a printed circuit board 2 to be assembled. Holes 3 are provided in the printed circuit board for insertion of the terminal wires of various components.

Above the printed circuit board 2 there is arranged a device 4, operable in two coordinate directions as illustrated by arrows A and B. The device 4 contains a projector lamp 5, in whose path of light is arranged a lens 6. Behind the lens 6 is located a slide plate 9, which is displaceable perpendicular to the optical axis 24 of the lens, as illustrated by the arrow C. The slide plate 9 contains a first hole 10, a second hole 11 and a slot 12 running in the direction of displacement. The two holes 10, 11 and the slot 12 are arranged on a line in the direction of displacement.

The hole 11 is filled with a colored transparent material. In relation to the slot 12, the hole 11 is beyond the hole 10. Between the slide plate 9 and the lens 6 is arranged a shutter 7. The shutter 7 may be displaced parallel to the slide plate 9, i.e., thus perpendicular or transverse to the optical axis 24 as illustrated by the arrow D. The displaceable shutter 7 is shown in lower end position in FIG. 1. A stationary shutter 8 is arranged in alignment with the displaceable shutter 7. When the shutter 7 is in its lower end position, as shown, the stationary shutter 8 and the movable shutter 7 define a common opening corresponding to the diameter of the hole 10.

Behind the slide plate 9 is arranged an objective lens 13, which is mounted to be movable in the direction of the optical axis 24 to permit focusing. The objective lens 13 is followed, in the direction of radiation from the lamp 5, by a mirror 16, which is arranged at an angle of 45° to the optical axis 24 and which deflects the beam of light perpendicular to the printed circuit board 2 to be assembled.

The slide plate 9 is capable of turning about the optical axis 24, as indicated by the arrow 15. Likewise capable of turning with the slide plate 9 are the movable shutter 7 and the stationary shutter 8, as indicated by the arrow 14.

When the shutter 7 is moved away from the optical axis 24, it exposes the slot 12 in the slide plate 9. In this way an approximately circular spot of light, as well as a bar of light, appears on the circuit board 2 to be assembled. The circular spot of light is produced by the hole 10. The bar of light is produced by the slot 12. The length of the bar of light depends upon how far the shutter 7 has been drawn back from the optical axis 24.

The slide plate 9 may be shifted transverse to the optical axis 24 between two positions. In the position shown in FIG. 1 the hole 10 is in alignment with the optical axis 24. The hole 10 produces a wide spot of light. In the other position of displacement the hole 11, filled with transparent colored material, is in alignment with the optical axis 24. In this way a colored spot of light appears on the printed circuit board 2 to be assembled. The polarity of a component may be shown by the colored spot of light. In the case of a diode, for example, it may be shown into which of two holes the lead for the anode or the cathode is to be inserted.

In FIG. 2 there are represented the individual patterns of light which may be obtained with the device of FIG. 1. FIG. 2a shows two points of light, of which the left-hand one, for example, is a red point of light, while the right-hand one is a white point of light. The distance between the two points of light corresponds to the scanning size of the printed circuit board to be assembled. To produce this luminous pattern, the slide plate 9 must be shifted such that the hole 11 is in alignment with the optical axis 24. In addition, the shutter 7 must be pushed back so far that it exposes the hole 10 but covers the slot 12.

FIG. 2b shows a luminous pattern with two white points of light. To create this pattern of light, the slide plate 9 must be in the position shown in FIG. 1. This means that the hole 10 is in alignment with the optical axis 24. The shutter 7 must be drawn back far enough to expose a short section of the slot 12.

The light pattern in FIG. 2c shows a white spot of light and a bar of light. To produce this pattern, the hole 10 in the slide plate 9 must be in alignment with the optical axis 24 and the shutter 7 must be drawn back far enough to expose a part of the slot 12.

To produce the pattern of light of FIG. 2d, the hole 11 in the slide plate 9 must be aligned with the optical axis 24 and the shutter 7 must be drawn back far enough to expose the hole 10 as well as a portion of the slot 12. In this case a red spot of light, a white spot of light and a white bar of light appear.

The light pattern of FIG. 2e serves to indicate three holes, which may be designed, for example, for the insertion of the leads of a transistor. Therein appear a red spot of light and a white spot of light, the white spot of light turning and oscillating about the red spot of light. To obtain this light pattern, the slide plate 9 must be adjusted such that the hole 11 is in alignment with the optical axis 24. At the same time the shutter 7 must be drawn back far enough to expose the hole 10 but cover the slot 12. In addition, the slide plate 9, the shutter 7 and the shutter 8 must be turned in an oscillating manner about the optical axis.

A preferred form of the device 4, which is represented schematically in FIG. 1 is shown structurally in FIG. 6. As can be seen in FIG. 6, there is provided, on an assembly bench 1, a printed circuit board 2 with holes 3, ready for assembly. Beside the printed circuit board 2 there is arranged a coordinate table. This coordinate table comprises a base plate 66 attached to the assembly bench 1, and a stepping motor 68 attached to the base plate by an angle bracket 67. The stepping motor drives a threaded spindle 70 by way of a coupling 69. The threaded spindle 70 passes through an internally threaded angle plate. The angle plate 71 is attached to a first slide which is mounted on the base plate 66 to move in the direction of a single headed arrow E. By means of an angle plate 73 an additional stepping motor 74 is attached to the first slide 72. The motor 74 drives a threaded spindle 76 by way of a coupling 75. The threaded spindle 76 passes through an internally threaded angle plate 77. The angle plate 77 is attached to a second slide 78, which is displaceable, in the direction of a double headed arrow F, perpendicular to the direction of displacement of the first slide 72.

Beside the coordinate table there is located a stand 79 with a projecting supporting element 80, part of which overlaps the coordinate table. To the supporting element is attached a lever bar, designed in the manner of a pantograph. This supporting system comprises two long arms 81, 83 and two short arms 19, 84. The long arm 81 is attached to the supporting element 80 by means of a pivot 82. The short arm 84 is interconnected with the long arm 81 by a pivot 88. The pivot 88 is substantially nearer to the pivot 82 than to the pivot 87. The short arm 84 is also interconnected with the long arm 83 by a pivot 86. The short arm 19 is interconnected with the long arm 83 by a pivot 89. The long arms 83, 81 and the short arm 84, 19 together form a linked quadrangle or parallelogram. The long arm 81 is in practice extended beyond the point of the pivot 88 by the short arm 84, the attachment to the supporting element. The short arm 19 is extended beyond the pivot 89. The short arm 84 is attached by a pivot 85 to the second coordinate slide 78 and conforms to the motion of the latter.

Figure 7:
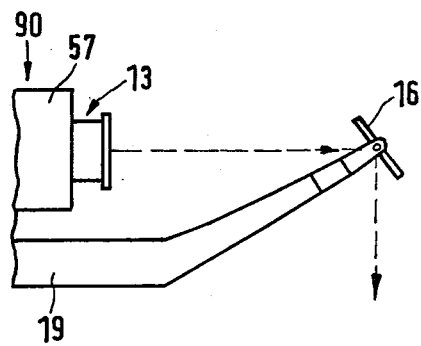
FIG. 7 is a view taken along line VII—VII of FIG. 6.

On the arm 19 is seated an optical part 90 of the device, which is represented in greater detail in FIG. 4. The arm 19 is also provided with a fork-shaped extension which mounts the mirror 16. The end region of the arm 19 and the front region of the optical part 90 of the device can be seen in side view in FIG. 7.

As can be seen in FIG. 4, the optical part of the device comprises two housing sections 20, 21, which are attached to the arm 19. A cylindrical pivoted member 22 is supported for rotation in the housing part 21. The pivoted member 22 is provided with a projection 50, against which is supported a gear wheel 49. On the gear wheel rests a spacer ring 54, against which is supported the inner cage of a roller bearing 55. The inner cage is pressed against the spacer ring 54 by means of a ring nut 56. The outer cage of the roller bearing 55 is supported on a projection of the housing part 21; and it is pressed against the housing part by a ring nut 57 screwed into the housing part 21. The ring nut 57 also has an internal thread into which is screwed the objective lens 13.

The pivoted member 20 is provided with a slot guide 30 for the slide plate 9, the movable shutter 7 and the stationary shutter 8. The stationary shutter 8 is tightly connected with the pivoted member 22. The movable shutter 7 is supported on the stationary shutter 8 by means of springs 28, which are indicated by jagged lines. The springs 28 lie on opposite sides of the optical axis 24.

The pivoted member 22 is surrounded by a conical ring 31 having an internal cone surface 32. The slide plate 9 is slidingly supported on the ring 31 to project out from the pivoted member 22. The end of the slide plate 9 located in the pivoted member 22 is biased by a spring 29 on the pivoted member 22; and the spring presses the slide plate against the internal cone surface 32. The conical ring 31 has a plurality of blind holes 33, running parallel to the optical axis 24, into which pins 35 project. These pins are supported by way of springs 34 at the bottom of the blind holes. The pins are attached at their outer ends to the gear wheel 49. When the conical ring 31 is displaced along the optical axis 24, the free end of the slide plate 9 slides on the internal cone surface 32 and is displaced perpendicular to the optical axis.

An adjusting ring 36 is arranged in the conical ring 31 concentric to the optical axis 24 and to the conical ring 31. The adjusting ring 36 is likewise formed with an internal cone surface 37. Against this internal cone surface there rests a cam projection of a transmission lever 38, which is supported at a pivot 39 in a recess 40 of the pivoted member 22. The transmission lever is provided with a lever extension which is in contact with the end of the movable shutter 7 projecting from the pivoted member 22. The point of contact between the transmission lever 38 and the movable shutter 7 moves farther from the pivot 39 than the cam projection by which the transmission lever 38 rests on the internal cone surface 37. The adjusting ring 36 also has a plurality of blind holes 41 distributed over the periphery, and pins 43 project into these holes. The pins 43 are also attached to the gear wheel 49. Each pin 43 is biased by a spring extending between the pin and the bottom of its respective blind hole 41. In this way the adjusting ring 36 may be displaced along the optical axis 24 with the springs 42 seeking to press the adjusting ring 36 leftward. Displacement of the adjusting ring 36 along the optical axis 24 causes the transmission lever 38 to swing about its pivot 39; and a small displacement of the ring 36 leads to a relatively great swing, i.e., to a relatively great displacement of the movable shutter 7.

The housing part 20 is provided with a central bore 25, in which are located the projector bulb 5 and a reflective mirror 26 as well as the lens 6.

The housing part 21 is provided with a screw-on plate 53, to which is attached a stepping motor 52. The shaft of the stepping motor 52 passes through the housing part 21 and at its outer end it supports a pinion 51, which meshes with the gear wheel 49. Thus the pivoted member 22 may be turned by actuation of the motor 52.

Figure 5:
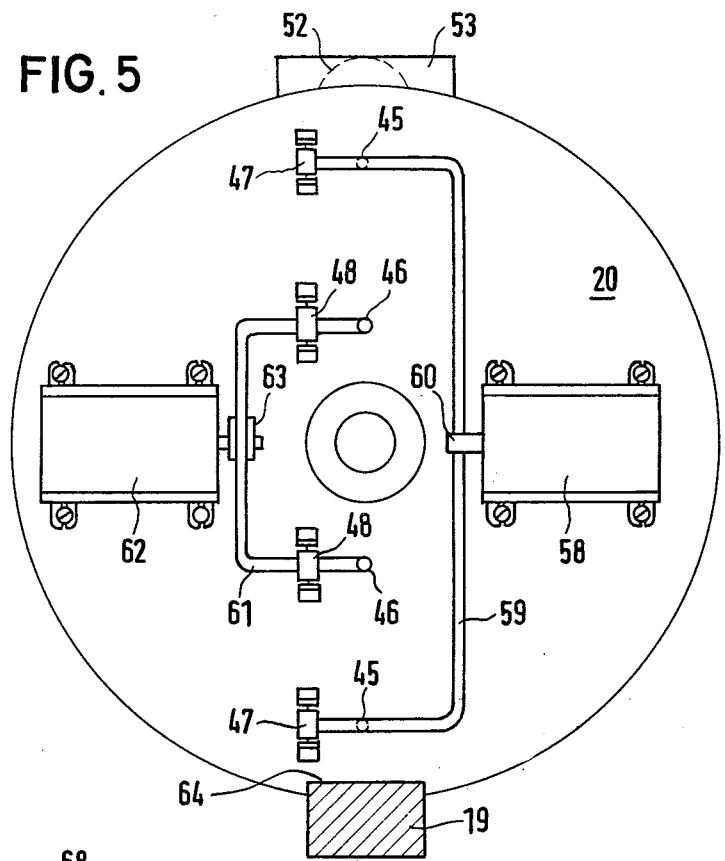
FIG. 5 is a view of the optical illuminating system of FIG. 4 taken in the direction of the arrow V.

The housing part 20 is provided with four holes through which pass glide elements 45, 46. As may be seen from FIG. 5, the glide elements 45 are interconnected by a joint bracket 59, which is attached at both its ends by bearings 47 to the housing part 20. The pressure of the springs 34 acts on the glide elements 45. The joint bracket 59 is thereby resiliently biased away from the housing part 20. As can be seen in FIG. 5 the joint bracket 59 is overlapped by an inclined plane at the end of the armature 60 of an electromagnet 58, which is capable of being switched between two settings. In one setting the conical ring 31 is arranged such that it presses the slide plate 9 into a position in which, as shown in FIG. 4, the hole 10 is in alignment with the optical axis 24. In the other setting the conical ring assumes a position in which the slide plate 9 is adjusted such that the hole 11 is in alignment with the optical axis 24.

The glide elements 46 are likewise interconnected, specifically by a joint bracket 61, which is pivotally linked by two bearings 48 to the front of the housing part 20. The pressure of the springs 42 acts on the glide elements 46. The joint bracket 61 hence has a tendency to rest against the front of the housing part 20. Extending out below it, however, is a cam 63 arranged on the shaft of a stepping motor 62. On turning of the cam 63 the glide elements 46 push the adjusting ring 36 against the action of the springs 42, comparatively far away from the housing part 20. In this way, as explained, the movable shutter 7 is moved relative to the optical axis 24.

Figure 8:
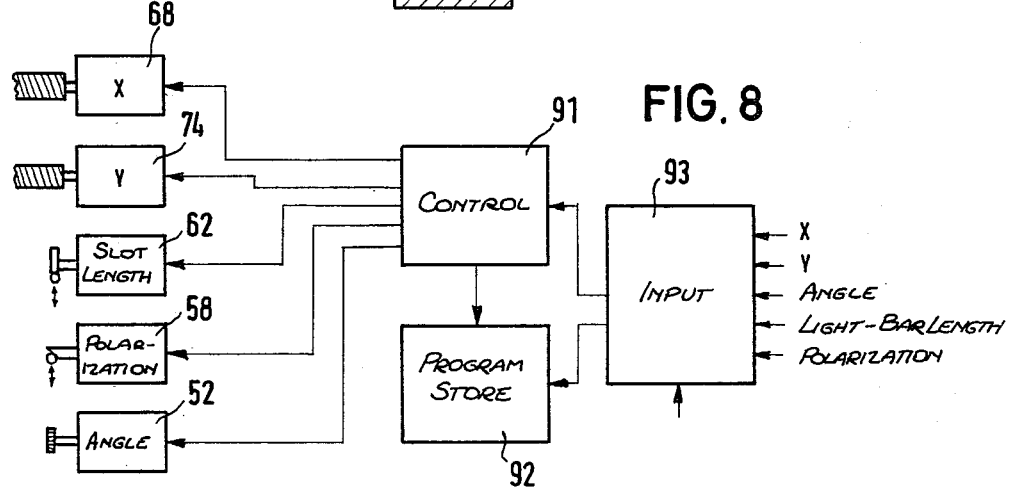
FIG. 8 is a block diagram of the electronic portion of the device of FIG. 1.

The electronic circuitry for the device is represented as a block diagram in FIG. 8. First the commands for the X motion and the Y motion of the two stepping motors 68, 74 of the coordinate table are entered in an input part 93. The X and Y control commands are converted into electrical signals by a control part 91. Shifting of the coordinate table results in correspondingly parallel shifting of the mirror 16 in FIG. 6 above the printed circuit board 2 to be assembled. The movable shutter 7 is therein first closed, so that only a single point of light appears.

When, for example, as shown in FIG. 3, two holes 3, between which an electric component is to be placed, are to be programmed for repeated illumination, a point of light 61, as shown in FIG. 3b, is first moved to one of the holes 3. Then a storage command is entered in the input part 93, whereby the X and Y coordinates, or the electrical signals of the control part 91 corresponding to them, are stored in a program store 92.

The shutter 7 is then moved back into its outermost end position, so that the slot 12 in the slide plate 9 is fully exposed. This causes a bar of light 17, which at first is non-directional, to appear on the printed circuit board to be assembled, as shown in FIG. 3c, beside the point of light 61. Actuation of a knob (not shown) on the input part 93 for angular adjustment now results in setting the stepping motor 52 into operation. The bar of light 17 thereby continuously moves radially about the point of light 61. When the bar of light 17 passes across the other hole 3 as shown in FIG. 3d, the angular motion is stopped and the angle is stored in the program storage 92 by a corresponding storage command.

Thereafter, by pressing a knob (not shown), the stepping motor 62 for controlling the light bar length is set into operation. This causes the shutter 7 to be moved gradually toward the optical axis 24. When the end of the bar of light 17 is over the other hole 3 to be assembled, as indicated in FIG. 3e, contraction of the bar of light is halted and the light-bar length is stored in the program storage 92 by a suitable storage command.

The position of the point of light 61 and the position, length and angle of the bar of light 17, as shown in FIG. 3f, are thereby now stored as fixed values and may be repeatedly recalled along with other similar values for this assembly pattern. The leads of the component 18 may then be inserted into the holes 3 in conformity with this assembly pattern.

When the component 18 is to be inserted into the holes 3 in a particular way, for example because polarization must be observed, the light pattern of FIG. 2d may be selected.

I claim:

1. A device for assembling printing circuit boards, said device comprising a support for a printed circuit board to be assembled, an optical illuminating system for illumination of at least one hole on said circuit board, and mounting means mounting at least a portion of said optical illuminating system to move above said support in a plane parallel thereto to direct light from said optical illuminating system to a selected location on the circuit board, said optical illuminating system comprising a housing, a light source, means directing light from said source along an optical axis, and a slide plate movable transverse to said optical axis, said slide plate being formed with at least one hole and one shot, and said slide plate being rotatable about said optical axis, said light source, said means directing light and said slide plate being mounted in said housing, said device further comprising a movable shutter mounted to extend across said optical axis along one side of said slide plate and movable to cover and uncover said slot, said shutter also being rotatable with said slide plate.

2. A device according to claim 1, wherein the mounting means comprises a mechanical lever mechanism of the pantograph type which includes an arm projecting over said support, with said portion of said optical system mounted on said mechanism, and a slide connected to said arm.

3. A device according to claim 1, wherein the slide plate and the shutter are both mounted for movement in a rotatable member, said rotatable member being arranged to be rotated about said optical axis.

4. A device according to claim 3, wherein the rotatable member is coupled to a stepping motor for rotation thereby.

5. A device according to claim 4, wherein the stepping motor is attached to the housing, with a pinion driven by said stepping motor meshed with a gear wheel attached to the rotatable member.

6. A device according to claim 3, wherein a conical ring is positioned adjacent the rotatable member and is displaceable in relation to the latter in the direction of the optical axis, said conical ring having a conical surface extending obliquely to the optical axis, said slide plate being in slideable contact with said conical surface.

7. A device according to claim 4 wherein an adjusting ring is mounted to rotate with said rotatable member and is displaceable in relation to the latter along said optical axis, said adjusting ring being formed with an internal conical surface which controls movements of said shutter whereby when said ring moves relative to said rotatable member along said optical axis said shutter moves transversely to said optical axis.

8. A device according to claim 5 wherein an adjusting ring is mounted to rotate with said rotatable member and is displaceable in relation to the latter along said optical axis, said adjusting ring being formed with an internal conical surface which controls movements of said shutter whereby when said ring moves relative to said rotatable member along said optical axis said shutter moves transversely to said optical axis.

9. A device according to claim 6 wherein an adjusting ring is mounted to rotate with said rotatable member and is displaceable in relation to the latter along said optical axis, said adjusting ring being formed with an internal conical surface which controls movements of said shutter, whereby when said ring moves relative to said rotatable member along said optical axis said shutter moves transversely to said optical axis.

10. A device according to claim 6, wherein glide elements rest against the conical surface of said conical ring and a stepping lever is mounted to move said guide elements in response to the action of a lifting magnet to displace said glide elements and said conical ring along said optical axis.

11. A device according to claim 10, wherein in the lifting magnet moves an inclined surface to actuate said lever.

12. A device according to claim 7, wherein the glide elements rest against said adjusting ring and a jointed lever is mounted to move said glide elements in response to the operation of a stepping motor coupled to said jointed lever via a cam disk, to displace said glide elements and said adjusting ring along said optical axis.

13. A device according to claim 12, wherein a stepping motor is attached to the housing and is coupled to said rotatable member to rotate same and wherein a conical ring is positioned adjacent the rotatable member and is displaceable in relation to the latter in the direction of the optical axis, said conical ring having a conical surface extending obliquely to the optical axis, said slide plate being in slideable contact with said conical surface, wherein glide elements rest against said conical ring and a stepping lever is mounted to move said guide elements in response to the action of a lifting magnet to displace said glide elements and said conical ring along said optical axis.

14. A device according to claim 13, wherein an electronic circuit is arranged to control the stepping motor for turning of the rotatable member, the lifting magnet for displacement of the slide plate and the stepping motor for displacement of the shutter, wherein an additional stepping motor is provided for one coordinate direction of the coordinate slide and still another stepping motor for the other coordinate direction of the coordinate slide, wherein there is provided a data input device for entry of data for the two coordinate directions of the coordinate slide, the angle and the length of the slot produced by said shutter and the position of the slide plate, wherein a data storage device is connected to receive data from said data input device and wherein said data storage device is connected to direct signals to said stepping motors and said lifting magnet according to the data stored therein.

15. A device for assembling printed circuit boards having holes therein, said device comprising an illuminating system for illuminating at least one of the holes in a printed circuit board, said illuminating system being supported above the circuit board to be assembled and further being arranged to be moved by means of servomotors automatically controlled by memorized information, said illuminating system being supported by a lever mechanism of the pantograph type and slidable as a whole in a plane parallel to the circuit board and said servomotors being coupled to the lever mechanism in a manner such that movements of the servomotors cause increased movements of the illuminating system.

16. A device according to claim 15 wherein said optical illuminating system comprises a housing, a light source, means directing light from said source along an optical axis, and a slide plate movable transverse to optical axis, said slide plate being formed with at least one hole and one slot, and said slide plate being rotatable about said optical axis, said light source, said means directing light and said slide plate being mounted in said housing.

17. A device according to claim 16, wherein the slide plate is formed with an additional hole which contains a transparent colored material, and in that this additional hole is arranged in alignment with the slot and the hole first mentioned.

18. A device according to claim 15 wherein the lever mechanism of the pantograph type is connected to a coordinate slide driven by said servomotors.

19. A device according to claim 15 wherein the illuminating system comprises a projecting system which projects parallel to the circuit board and a mirror mounted at the end of an arm of the pantograph-type lever mechanism supporting the illuminating device, said mirror being arranged to deflect the projection rays perpendicular to the circuit board.

* * * * *